United States Patent
Ye et al.

(10) Patent No.: US 12,080,516 B2
(45) Date of Patent: Sep. 3, 2024

(54) HIGH DENSITY PLASMA ENHANCED PROCESS CHAMBER

(71) Applicant: Applied Materials, Inc., Santa Clara, CA (US)

(72) Inventors: Zheng John Ye, Santa Clara, CA (US); Jianhua Zhou, Campbell, CA (US); Shouqian Shao, Fremont, CA (US); Suhail Anwar, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/456,236

(22) Filed: Nov. 23, 2021

(65) Prior Publication Data

US 2023/0162947 A1   May 25, 2023

(51) Int. Cl.
*C23C 16/34*   (2006.01)
*C23C 16/30*   (2006.01)
*C23C 16/40*   (2006.01)
*C23C 16/505*   (2006.01)
*H01J 37/32*   (2006.01)

(52) U.S. Cl.
CPC ...... *H01J 37/32119* (2013.01); *C23C 16/308* (2013.01); *C23C 16/345* (2013.01); *C23C 16/401* (2013.01); *C23C 16/505* (2013.01); *H01J 37/32532* (2013.01); *H01J 2237/332* (2013.01)

(58) Field of Classification Search
CPC .......... H01J 37/32119; H01J 37/32532; H01J 2237/332; H01J 37/32082; H01J 37/32091; H01J 37/3244; H01J 37/32449; H01J 37/32541; H01J 37/32568; H01J 37/32651; C23C 16/308; C23C 16/345; C23C 16/401; C23C 16/505; C23C 16/452; C23C 16/45565
See application file for complete search history.

(56) References Cited

U.S. PATENT DOCUMENTS

| | | | |
|---|---|---|---|
| 5,540,800 A | 7/1996 | Qian | |
| 2004/0194890 A1* | 10/2004 | Moroz | H01J 37/32082 156/345.48 |
| 2005/0199343 A1* | 9/2005 | Ohkuni | H01J 37/321 216/75 |
| 2007/0004208 A1* | 1/2007 | Ohkuni | H01J 37/32522 438/689 |

(Continued)

FOREIGN PATENT DOCUMENTS

WO   2021-126172 A1   6/2021

OTHER PUBLICATIONS

PCT International Search Report and Written Opinion dated Apr. 20, 2023 for PCTUS/2022/050769.

*Primary Examiner* — Katherine A Bareford
*Assistant Examiner* — Christina D McClure
(74) *Attorney, Agent, or Firm* — Patterson + Sheridan, LLP (57) ABSTRACT

The present disclosure is directed to a showerhead for distributing plasma. The showerhead includes a perforated tile coupled to a support structure. A dielectric window is disposed over the perforated tile. An electrode is coupled to the dielectric window. An inductive coupler is disposed over the dielectric window. At least a portion of the inductive coupler is angled relative to at least a portion of the electrode.

22 Claims, 6 Drawing Sheets

(56) References Cited

U.S. PATENT DOCUMENTS

| | | | |
|---|---|---|---|
| 2007/0243693 A1* | 10/2007 | Nemani | H01L 21/76224 |
| | | | 257/E21.546 |
| 2008/0124254 A1 | 5/2008 | Choi | |
| 2016/0071704 A1* | 3/2016 | Benveniste | H01J 37/32119 |
| | | | 29/601 |
| 2016/0118284 A1* | 4/2016 | Iwai | H01J 37/32522 |
| | | | 361/234 |
| 2017/0178899 A1* | 6/2017 | Kabansky | C23C 16/045 |
| 2017/0243721 A1 | 8/2017 | Nagorny et al. | |
| 2020/0194233 A1* | 6/2020 | Kao | H01J 37/32715 |

* cited by examiner

HIGH DENSITY PLASMA ENHANCED PROCESS CHAMBER

BACKGROUND

Field

Embodiments of the present disclosure generally relate to process chambers, such as high density plasma (HDP) chambers. More particularly, embodiments of the present disclosure relate to incorporating faraday shields to reduce capacitive coupling.

Description of the Related Art

In the manufacture of solar panels or flat panel displays, many processes are employed to deposit thin films on substrates, such as semiconductor substrates, solar panel substrates, and liquid crystal display (LCD) and/or organic light emitting diode (OLED) substrates, to form electronic devices thereon. The deposition is generally accomplished by introducing a precursor gas into a chamber having a substrate disposed on a temperature controlled substrate support. The precursor gas is typically directed through a gas distribution assembly disposed above the substrate support. The precursor gas in the chamber is energized (e.g., excited) into a plasma by applying a single or array of radio frequency (RF) antennas inductively coupled to the precursor gas to form the plasma. The excited gas reacts to form a layer of material on a surface of the substrate that is positioned on the temperature controlled substrate support.

The size of the substrates for forming the electronic devices exceeds 1 square meter in surface area. Uniformity in film thickness across these substrates is difficult to achieve. Film thickness uniformity becomes even more difficult as the substrate sizes increase. To provide uniform thicknesses, gases can be provided to the process volume in a plurality of gas distribution zones. Each of the gas distribution zones include plenums that are used to control gas distribution and plasma formation. RF power is used to form plasma that can cause parasitic plasma formation in volumes outside of the substrate process volume.

Accordingly, what is needed in the art is a method and apparatus for reducing or shielding an electric field carried by RF antenna and preventing the formation of parasitic plasma.

SUMMARY

Embodiments of the present disclosure include a method, apparatus, and system distributing plasma.

In some embodiments, a showerhead is provided having a perforated tile coupled to a support structure. A dielectric window is disposed over the perforated tile. An electrode is coupled to the dielectric window. An inductive coupler is disposed over the dielectric window. At least a portion of the inductive coupler is angled relative to at least a portion of the electrode.

In some embodiments, a plasma deposition chamber is provided having a showerhead having a plurality of perforated tiles coupled to a support structure. A plurality of dielectric windows is disposed over the plurality of perforated tiles, each dielectric window disposed over a corresponding perforated tile. A plurality of electrodes is coupled to the dielectric window to form a faraday shield. A plurality of inductive couplers is disposed over the plurality of dielectric windows. At least a portion of each inductive coupler is angled relative to at least a portion of each electrode.

In some embodiments, a method of depositing films on a substrate, includes flowing a precursor gas to a plurality of gas volumes of a showerhead. Each of the gas volumes is defined by a perforated tile, support members, and a faraday shield. The method includes providing radiofrequency power to an inductive coupler disposed above the faraday, the inductive coupler in electrical communication with each of the gas volumes; and distributing plasma to a process volume of a process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure include a processing system that is operable to deposit a plurality of layers on a large area substrate. A large area substrate as used herein is a substrate having major sides with a large surface area, such as a substrate having a surface area of typically about 1 square meter or greater. However, the substrate is not limited to any particular size or shape. In one aspect, the term "substrate" refers to any polygonal, squared, rectangular, curved or otherwise non-circular workpiece, such as a glass or polymer substrate used in the fabrication of flat panel displays, for example.

Herein, a showerhead is configured to flow gas therethrough and into a processing volume of a chamber in a number of independently controlled zones, in order to improve the uniformity of the processing of the surface of a substrate exposed to the gas in the processing zone. Additionally, each zone is configured with a plenum (e.g., gas volume), one or more perforated tiles between the plenum and the processing volume of the chamber. The plenum is formed between a dielectric window, a perforated tile, and a surrounding support structure. Each plenum is configured to allow processing gas(es) to be flowed thereinto and distributed to result in a relatively uniform flow rate, or in some case tailored flow rate, of the gases through the perforated tile and into the processing volume. The plenum in some embodiments has a thickness less than twice the thickness of a dark space of a plasma formed of the process gas(es) at the pressures thereof within the plenum. An inductive coupler, such as an radiofrequency (RF) antenna, is positioned proximate to the dielectric window opposite the plenum, and it inductively couples energy through the dielectric window, plenum, and perforated tile, such as a ceramic perforated tile, to strike and support a plasma in the processing volume. Additionally, in the region between adjacent perforated tiles, an additional process gas flow is provided. The flow of the process gas(es) in each zone and through the region between the perforated tiles is controlled to result in uniform or tailored gas flows to achieve desired process results on the substrate. It has been discovered that parasitic plasma can form within the plenum at high radiofrequency power. The parasitic plasma can deposit film within a surface defining the plenum, such as on a surface of the perforated tile. It has been discovered that providing a faraday shield within the dielectric window reduces an electric field within the plenum below, while enabling a magnetic flux to pass through the dielectric window to be used for substrate processing.

Embodiments of the disclosure include a high density plasma chemical vapor deposition (HDP CVD) processing chamber that is operable form one or more layers or films on a substrate. The processing chamber as disclosed herein is adapted to deliver energized species of a precursor gas that are generated in a plasma. The plasma may be generated by inductively coupling energy into a gas under vacuum. It is to be understood that the embodiments discussed herein may be practiced in other chambers capable of providing high density plasma.

Figure 1:
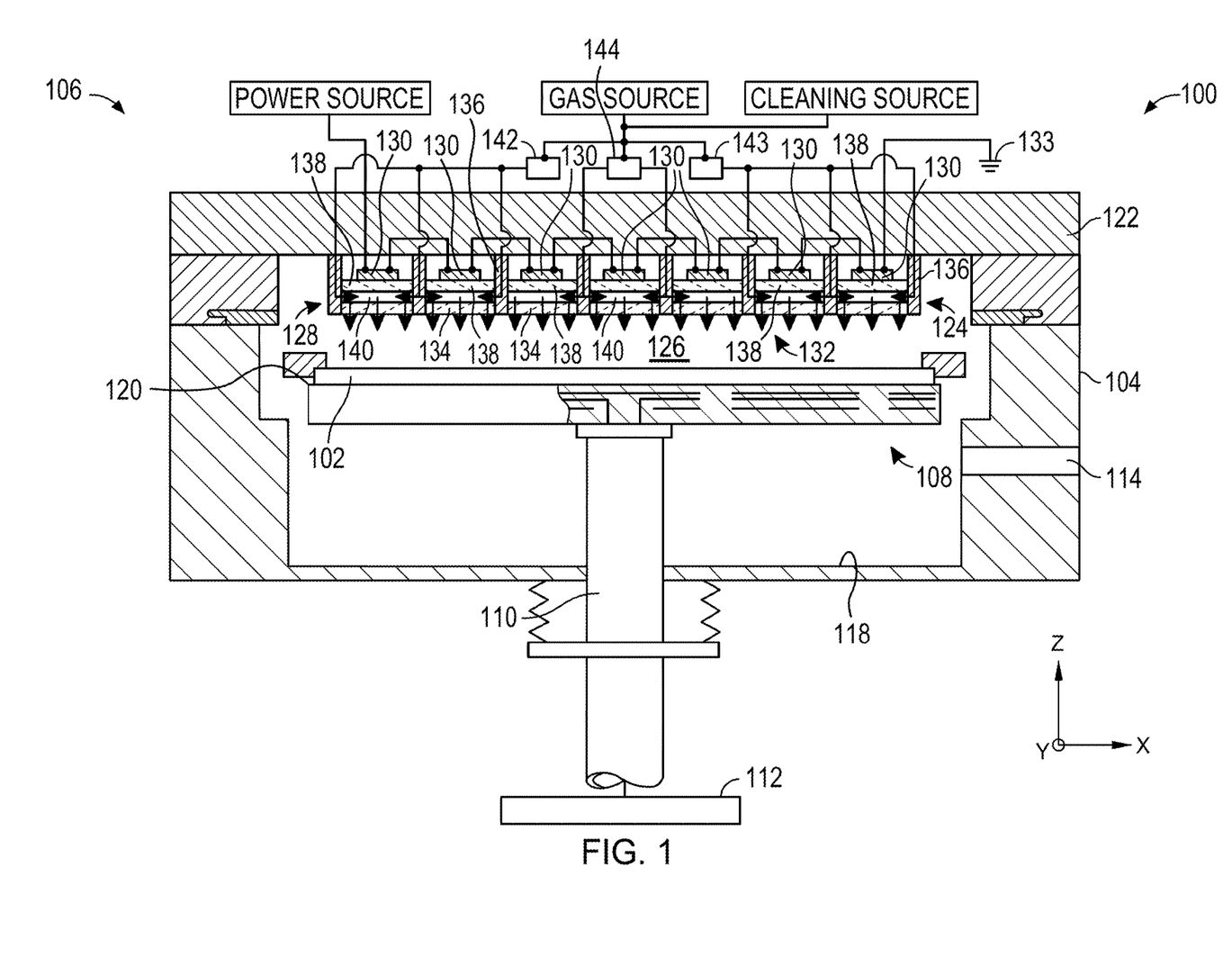
FIG. 1 is a schematic cross-sectional front view of a chamber according to an embodiment.

FIG. 1 is a cross sectional side view showing an illustrative processing chamber 100, according to one embodiment of the present disclosure. An exemplary substrate 102 is shown on a substrate surface 120 within a chamber body 104. The processing chamber 100 also includes a lid assembly 106, a bottom 118 disposed opposite the lid assembly 106, and a pedestal or substrate support assembly 108 disposed between the lid assembly 106 and the bottom 118. The lid assembly 106 is disposed at an upper end of the chamber body 104, and the substrate support assembly 108 is at least partially disposed within the chamber body 104. The substrate support assembly 108 is coupled to a shaft 110. The shaft 110 is coupled to a drive 112 that moves the substrate support assembly 108 vertically (in the Z direction) within the chamber body 104. The substrate support assembly 108 of the processing chamber 100 shown in FIG. 1 is in a processing position. However, the substrate support assembly 108 may be lowered in the Z direction to a position adjacent to a transfer port 114.

The lid assembly 106 may include a backing plate 122 that rests on the chamber body 104. The lid assembly 106 also includes a gas distribution assembly or showerhead 124. The showerhead 124 delivers process gases from a gas source to a processing region 126 between the showerhead 124 and the substrate 102. The showerhead 124 is also coupled to a cleaning gas source that provides cleaning gases, such as fluorine containing gases, to the processing region 126.

The showerhead 124 also functions as a plasma source 128. To function as the plasma source 128, the showerhead 124 includes one or more inductively coupled plasma generating components, or inductive coupler 130. Each of the one or more inductive couplers 130 may be a single inductive coupler 130, two inductive couplers 130, or more than two inductive couplers 130, are simply described as inductive couplers 130 hereafter. Each of the one or more inductive couplers are coupled across a power source and ground 133. Although FIG. 1 depicts each of the inductive couplers 130 connected to the power source and ground 133 in series, a connection in parallel is also contemplated such that each inductive coupler 130 is connected and controlled independently to the power source and ground 133. In some embodiments, ground 133 is a capacitor. The showerhead 124 also includes a face plate 132 that comprises a plurality of discrete perforated tiles 134. The power source includes a match circuit or a tuning capability for adjusting electrical characteristics of the inductive couplers.

Figure 2:
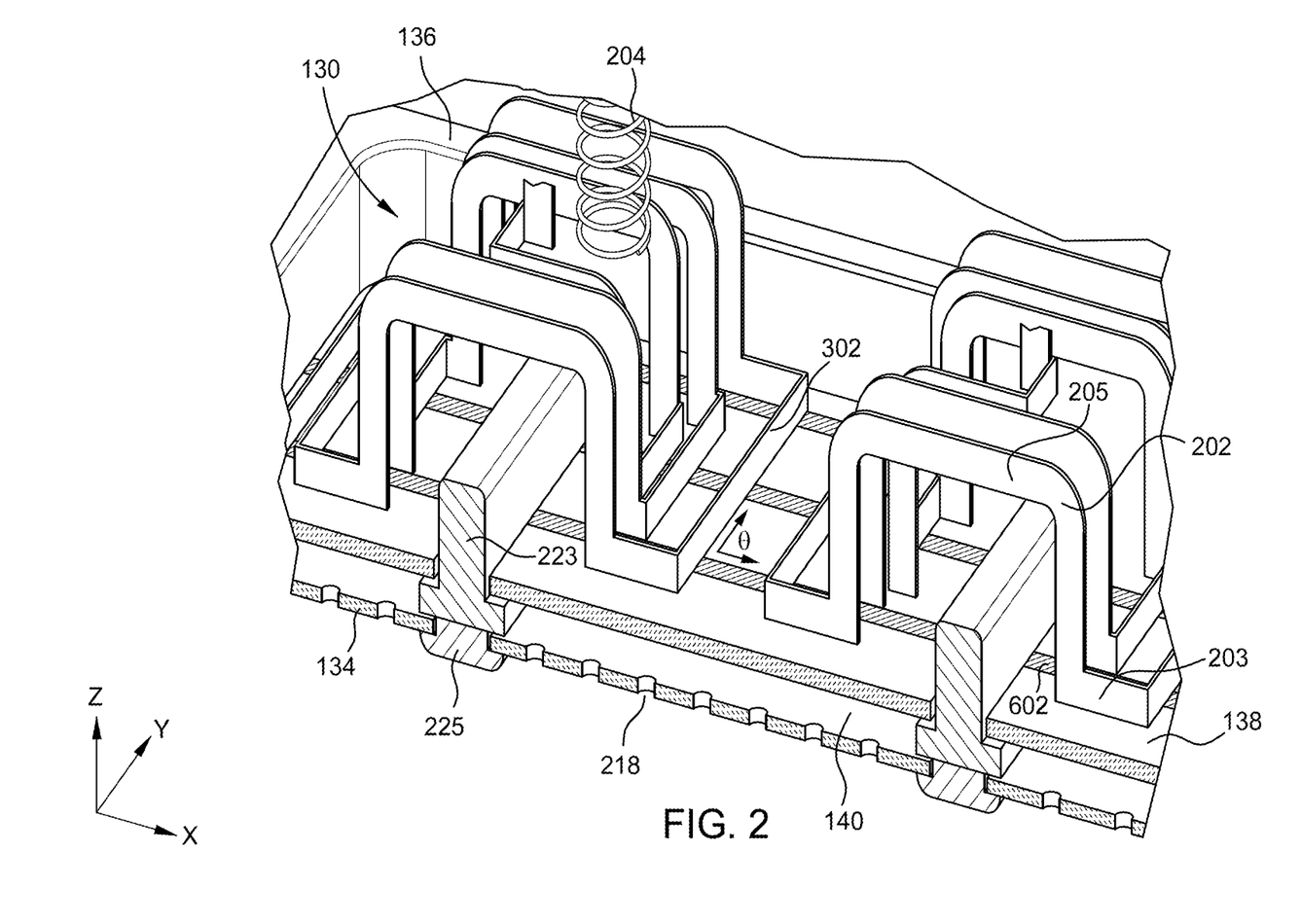
FIG. 2 is a cross-sectional perspective side view of a portion of a lid assembly according to an embodiment.

Each of the perforated tiles 134 are supported by a plurality of support members 136. Each of the one or more inductive couplers or portions of the one or more inductive couplers are positioned on or over a respective dielectric window 138. An example of an inductive coupler 130 that is disposed over the dielectric windows 138 within the lid assembly 106 is shown in FIG. 2. A plurality of gas volumes 140 are defined by surfaces of the dielectric windows 138, the perforated tiles 134 and the support members 136. Each of the one or more inductive couplers 130 is configured to create an electromagnetic field that energizes the process gases into a plasma in the processing region 126 below the gas volumes 140 as gas is flowing into the gas volumes 140 and into the chamber volume therebelow through the adjacent perforated tile. In some embodiments, process gases from the gas source are provided to each of the gas volumes 140 via conduits in the support members 136. The volume or flow rate of gas(es) entering and leaving the showerhead are controlled in different zones of the showerhead 124. Zone control of processing gases is provided by a plurality of flow controllers, such as mass flow controllers 142, 143 and 144 illustrated in FIG. 1. For example, the flow rate of gases to peripheral or outer zones of the showerhead 124 is controlled by the flow controllers 142, 143, while the flow rate of gases to a central zone of the showerhead 124 is controlled by the flow controller 144. When chamber cleaning is required, cleaning gases from a cleaning gas source is flowed to each of the gas volumes 140 and thence into the processing volume 140 within which the cleaning gases are energized into ions, radicals, or both. The energized cleaning gases flow through the perforated tiles 134 and into the processing region 126 in order to clean chamber components.

FIG. 2 is an enlarged cross-sectional side view of a portion of the lid assembly 106 of FIG. 1 from a side view of a transfer port 114. The perforated tiles 134 include a plurality of openings 218 extending therethrough. Each of the plurality of openings 218 allow gases to flow from the gas volumes 140 into the processing region 126, at predetermined flow rates due to the diameter of the openings 218. A mounting portion 225 surrounds the sides of adjacent perforated tiles 134 at an interface of adjacent perforated tiles 134. The mounting portion 225 includes a ledge or shelf that supports a portion of the perimeter or an edge of the perforated tiles 134. The mounting portion 225 are fastened to interface members 223 by a fastener, such as a bolt or screw. Each interface member 223 includes a ledge or shelf that supports a portion of the perimeter or an edge of the dielectric window 138. In some embodiments, each interface member 223 is coupled on each end to adjacent support members 136.

The reduced lateral surface area of the multiple dielectric windows 138 allows the use of dielectric materials as a physical barrier between the vacuum environment and plasma in the gas volume 140 and processing region 126 and the atmospheric environment in which the adjacent inductive coupler 130 is typically positioned, without imposing large stresses therein based on a large area supporting the atmospheric pressure load.

Seals are used to seal the volumes (at atmospheric or near atmospheric pressures) from the gas volumes 140 (which are at sub-atmospheric pressures in the millitorr or less range during processing). In some embodiments, during processing, the gas volumes 140 have a vacuum pressure of about 10 mTorr to about 3 Torr. Materials for the showerhead 124/plasma source 128 are chosen based on one or more of electrical characteristics, strength and chemical stability. The inductive couplers are made of an electrically conductive material. The backing plate 122 and the support members 136 are made of a material that is able to support the weight of the supported components and atmospheric pressure load, which may include a metal or other similar material. The backing plate 122 and the support members 136 can be made of a non-magnetic material (e.g., non-paramagnetic or non-ferromagnetic material), such as an aluminum material. The perforated tiles 134 are made of a ceramic material, such as quartz, alumina or other similar material. The dielectric windows 138 are made of a quartz, alumina or sapphire materials. In some embodiments, the dielectric windows 138 include copper, silver, aluminum, tungsten, molybdenum, titanium, combinations thereof, or alloys thereof.

Each inductive coupler 130 includes an antenna 202 disposed proximate to one or more corresponding dielectric windows 138 and a coil 204 coupled to the antenna 202 and to a distribution line coupled to a matching network (e.g., power source). In some embodiments, an upper portion 205 of each antenna 202 is disposed over and at least partially surrounds interfaces of adjacent dielectric windows 138. Each antenna 202 is disposed over one or more dielectric windows 138 such that base portions 203, 302 are positioned on the dielectric windows 138. The base portion 203, 302 is connected in series with upper portion 205, which is shown in more detail in FIG. 3. The base portion 203, 302 is made up of first portions 203 oriented at an angle relative to the second portions 302, such as perpendicular to second portion 302 and disposed along an X-axis. The second portions 302 are shown along a Y-axis of FIG. 3. Each of the second portions 302 are parallel with respect to one another and each of the first portions 203 are parallel with respect to one another. Other additional portions are also contemplated to form alternative shapes and angles relative to one another. Angles between portions can be about 60 degrees to about 170 degrees, such as about 80 degrees to about 120 degrees, such as about 90 degrees to about 100 degrees.

Figure 3:
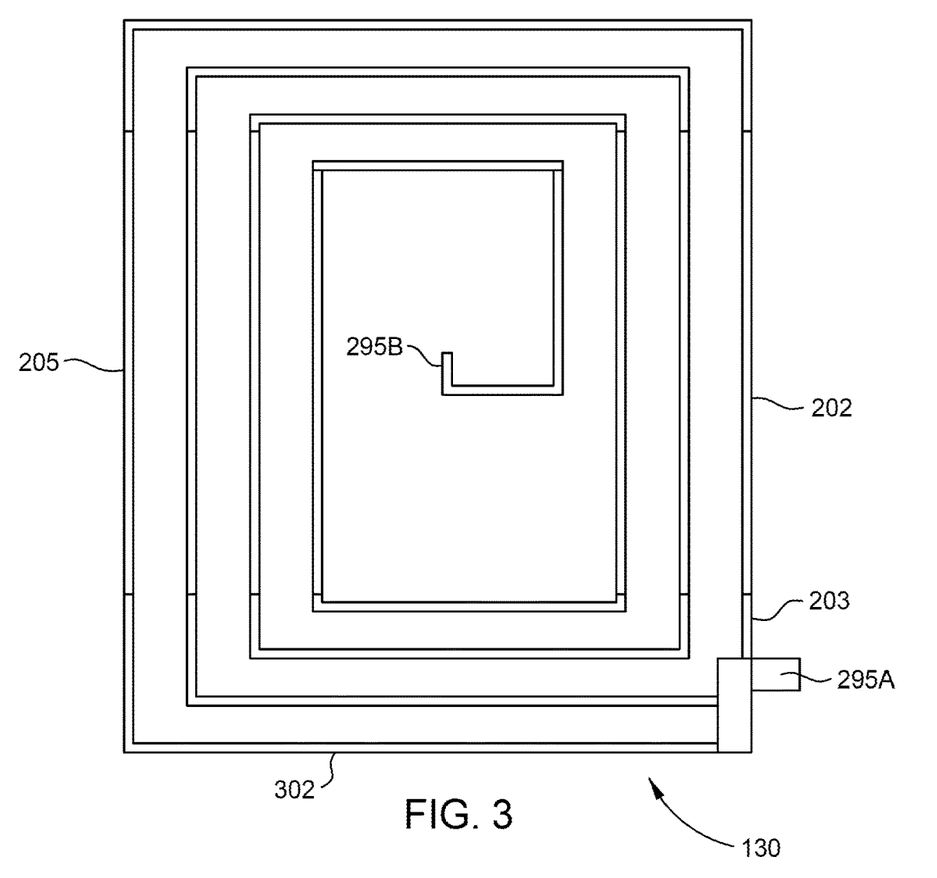
FIG. 3 is a top plan view of an antenna within a lid assembly according to an embodiment.

Each dielectric window 138 includes one or more electrodes 602. The electrodes 602 are angled relative to second portions 302 by an angle θ. Each electrode 602 is angled θ relative to a length of each second portion 302 of the antenna 202. In some embodiments, angle θ is about 10 degrees to 170 degrees, such as about 30 degrees to about 150 degrees, such as about 60 degrees to about 120 degrees, such as about 90 degrees. In some embodiments, the electrodes 602 are angled relative to about 50% or more of the base portion 203, 302, such as about 80% to 100% of the base portion 203, 302.

Figure 4:
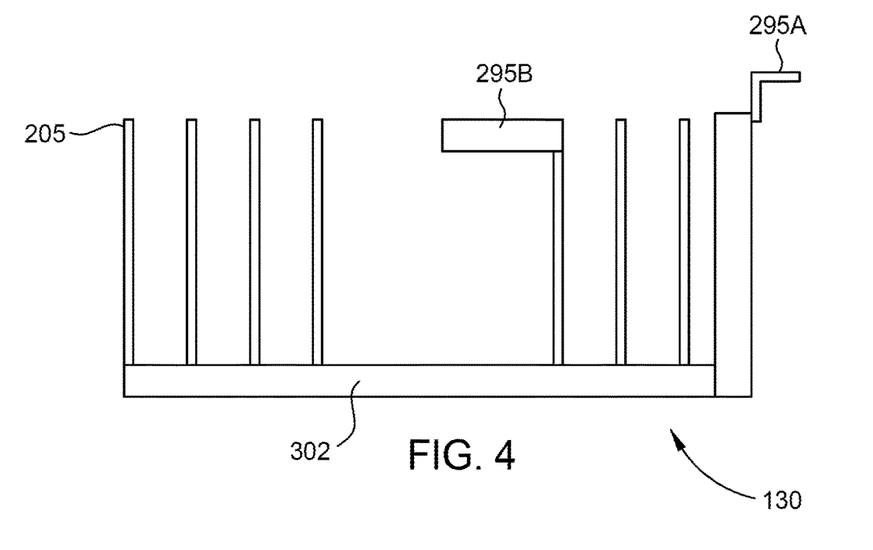
FIG. 4 is a side plan view of an antenna within a lid assembly according to an embodiment.

FIG. 3 is a top plan view of one embodiment of an antenna 202 positioned on the dielectric windows 138 found in the lid assembly 106. FIG. 4 is a side plan view of the antenna 202 positioned on the dielectric windows 138 found in the lid assembly 106. The antenna 202 configuration shown in FIG. 3 depicts one antenna 202 that can be arranged with adjacent antennas 202 having substantially the same configuration in a pattern across the showerhead 124. The antenna 202 includes a conductor pattern that is a rectangular spiral shape. Other spiral shapes are contemplated based on a shape the substrate. Electrical connections include an electrical input terminal 295A and an electrical output terminal 295B. Each of the one or more inductive couplers 130 of the showerhead 124 are connected in series and/or in parallel. In some embodiments, the electrode shape is selected based on the shape of the base of the antenna, such as first and second portions 203 and 302. In some embodiments, the electrode shape is a rounded L shaped with portions that are angled relative to the portions 302, such as substantially perpendicular to portions 302 and with electrode portions that are angled relative to the first portions 203, such as substantially perpendicular to first portions 203.

Figure 5:
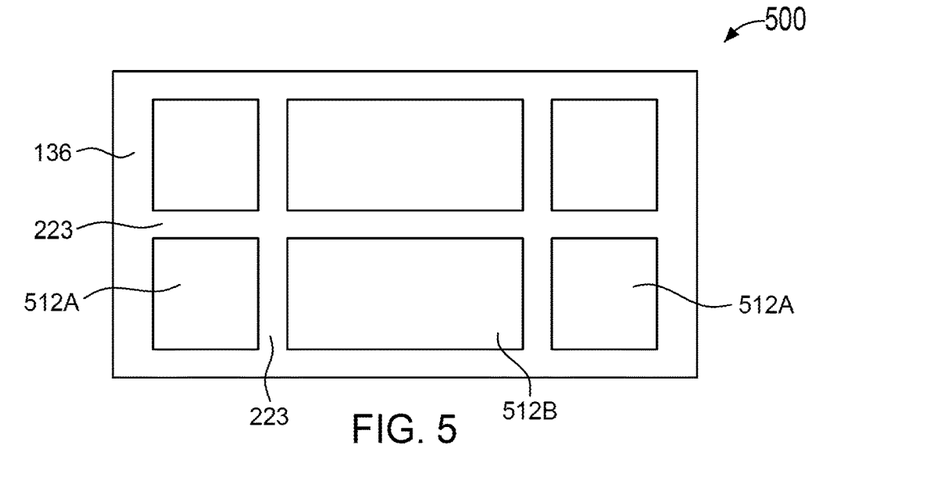
FIG. 5 depicts a top down view of support structure for perforated tiles and dielectric windows according to an embodiment.

FIG. 5 depicts a top down view of an example support structure 500 for the perforated tiles 134 and dielectric window 138. The support structure 500 includes the plurality of support members 136 and interface members 223. The support structure 500 includes a plurality of openings 512A, 512B through which the perforated tiles 134 and dielectric windows 138 are disposed. End openings 512A are disposed on each end of the support structure 500 and center openings 512B are disposed between two end openings 512A. Although only a single center opening 512B is depicted between two end openings, a plurality of center openings 512B are also contemplated depending on the size of the substrate to be processed. Each of the end openings 512A are shorter in length relative center openings 5126 disposed between. Each of the end openings 512A are equal in width relative to the center openings 512B. Although only two rows of end openings 512A, and center openings 512B are shown, other number of rows are contemplated depending on the dimensions and size of the substrate to be processed. In some embodiments, there are about 6 openings (each of 512A, 512B) to about 30 openings, such as about 8 openings to about 20 openings. In some embodiments, each end opening 512A corresponds to a half an antenna and each center opening 512B corresponds to a full antenna, such as two halves of two antennas disposed thereon.

Figure 6:
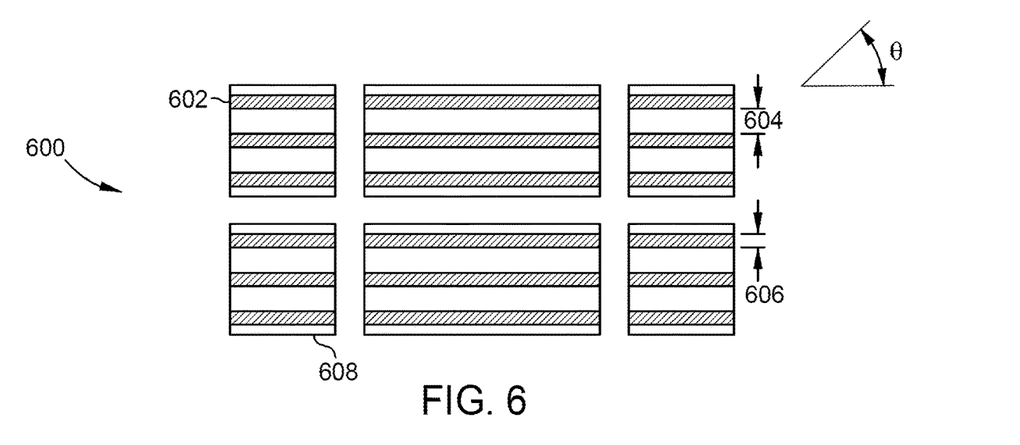
FIG. 6 depicts a plurality of electrodes coupled to a dielectric window according to an embodiment.

FIG. 6 depicts a plurality of faraday shields 600 coupled to the dielectric window 138. In some embodiments, the faraday shields 600 are grounded. Each faraday shield 600 includes a plurality of electrodes 602, such as about two electrodes per faraday shield 600 to about 20 electrodes, such as about 4 electrodes to about 12 electrodes, such as about 5 electrodes to about 11 electrodes. Each electrode 602 has an electrode width 606 is spaced apart from adjacent electrodes by an electrode spacing 604. In some embodiments, the spacing 604 is uniform or substantially the same between adjacent electrodes. Alternatively, the spacing 604 is different, such as reduced or increased spacing at the edges of the faraday shield relative to a center of the faraday shield. As used herein, the electrode spacing 604 is defined as a shortest distance between outermost surfaces of adjacent electrodes facing one another. Each electrode 602 is substantially parallel to one another. The electrode width 606 is about 5 mm to about 60 mm, such about 10 mm to about 50 mm. The spacing 604 is about 20 mm to about 60 mm, such as about 21 mm to about 54 mm. The spacing 604 and electrode width 606 is determined to enable a reduction in electric field under the faraday shields 600 while maintaining the magnetic field and ICP coupling. Spacing 604 that is wide and electrode width 606 that is narrow has a reduced faraday effect, however, spacing 604 that is narrow and electrode width 606 wide adversely inhibits magnetic field formation. Electrode spacing is determined based on gases used during a process, pressure, temperature, and other factors that affect RF electric field threshold.

The plurality of electrodes 602 are disposed on a first plane and the second portions 302 of the antenna 202 are disposed on a second plane disposed above the first plane. The first and second planes are parallel with respect to one another. Each electrode 602 is angled θ relative to a length of each second portion 302 of the antenna 202. In some embodiments, angle θ is about 10 degrees to 170 degrees, such as about degrees to about 150 degrees, such as about 60 degrees to about 120 degrees, such as about 90 degrees. The electrodes 602 are formed from any metal or conductive material. The material of the electrodes 602 is selected based on effectiveness for shielding and based on mechanical considerations. Electrode material is selected based on material density, modulus, thermal expansion coefficient, and other properties. Electrode material can include one or more of copper, steel, aluminum, silver, and iron. In some embodiments, the faraday shields 600 include copper, silver, aluminum, tungsten, molybdenum, titanium (such as titanium nitride), combinations thereof, or alloys thereof. In some embodiments, the faraday shields 600 include nickel alloys and stainless steel materials having permeability of greater than 1. In some embodiments, the faraday shields 600 include a dielectric supporting material including one or more of quartz, aluminum oxide, aluminum nitride or other ceramic materials.

Materials of the faraday shields 600 are selected based on a range of RF power used during processing within the chamber. Although parallel electrodes are depicted in the figures, other configurations and patterns are contemplated such as multiple electrodes arranged in repeating patterns, non-parallel electrodes, radially arranged electrodes (e.g., rectangular radially arranged electrodes, non-radially arranged electrodes, and other arrangements. In some embodiments, the arrangements of the electrodes are based on an arrangement of the antenna 202. In some embodiments, the faraday shields 600 are grounded via additional electrodes leading to the electrodes 602. The faraday shields 600 can be grounded by a single point of contact, sparse multiple contacts, dense multiple contacts, continuous contact with surrounding chamber ground, such as RF gaskets or other forms of contacts. Contact impedance is zero or substantially zero at significantly low levels at process frequencies.

Without being bound by theory, it is believed that the faraday shields 60 provide a substantial increase to a threshold of radiofrequency (RF) electric field level that strike plasma in volumes other than the process volume to form which is parasitic to main plasma intended for substrate processing, such as within process volume 140. The light-up threshold can be described by a Paschen discharge curve associated with pressure, gas composition, and flow rate conditions for certain gas delivery designs. As RF power is increased, parasitic plasma is formed above the designed threshold. Increasing the threshold enables increasing RF power while limiting parasitic plasma, such as limiting plasma in volumes within gas passageways, such as gas volume 140. Parasitic plasma in the volume 140 can result in film deposition on a top surface of the perforated tile 134 which can produce particulates that can contaminate substrates. It has been discovered that incorporating faraday shields 600 between antenna 202 and the gas volume 140 substantially increases the threshold level for plasma excitation below the faraday shield 600 such that higher RF power is possible.

In some embodiments, the RF power supplied to the inductive coupler 130 is about 1 kW to about 500 kW, such as about 5 kW to about 50 kW, such as about 10 kW to about 30 kW, such as about 15 kW to about 20 kW. In some embodiments, the RF power is supplied at a frequency of about 100 kHz to about 500 MHz frequency depending on the predetermined process and operating parameters. In some embodiments, the RF power is supplied to sustain a plasma having a plasma density of about $1 \times 10^{10}$ cm$^3$ to about $10 \times 10^{12}$ cm$^3$. It has been discovered that the faraday shield described herein enables raising an RF power by about 1 kW to about 10 kW, such as about 5 kW to about 8 kW to process substrates substantially free of defects related to parasitic plasma. An ability to raise the RF power enables an ability to raise throughput and produce more substrates.

Figure 7A:
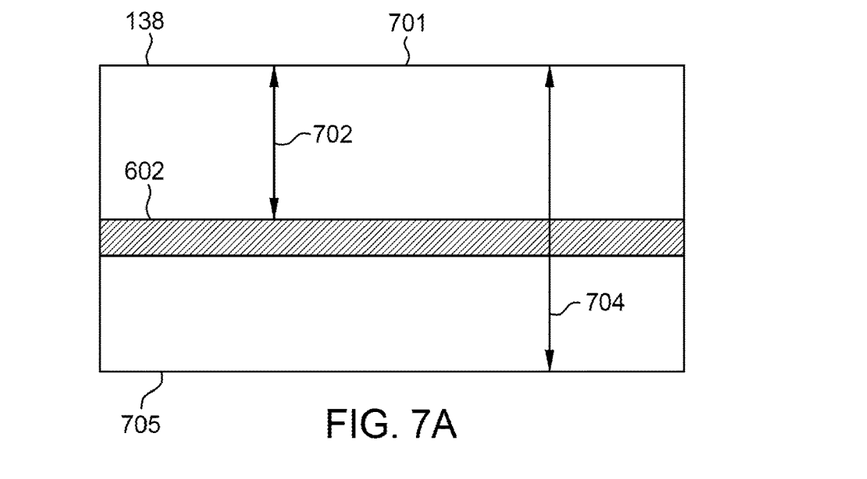
FIG. 7A is a side cross-sectional view of a dielectric window having electrodes incorporated therein according to an embodiment.

FIG. 7A is a side cross-sectional view of a dielectric window 138 having a faraday shield 600 incorporated therein. The faraday shield 600 can be disposed between an upper surface 701 and a bottom surface 705 of the dielectric window 138. It has been discovered that a positioning of the faraday shield 600 at or proximate to the upper surface 701 can induce arcing, such as in areas proximate to Teflon gas line covers. Arcing is formed in the small air gap due to the high voltage differential between the antenna (high voltage) and the grounded faraday shields over a short distance. Embedding the faraday electrodes within the dielectric window 138 (e.g., quartz material) eliminates the air gap around electrodes and reduces, such as substantially eliminates arcing. It has been further discovered that positioning the electrodes at or proximate to the bottom surface 705 of the dielectric window provides less effective shielding. The electrode 602 is embedded at a distance 702 from the upper surface 701 of the dielectric window 138, the distance 702 is about 10 mm to about 20 mm, such as about 12 mm to about 16 mm. In some embodiments, the electrodes 602 are disposed at the upper surface 701 of the dielectric window 138, or at the bottom surface 705 of the dielectric window 138. In some embodiments, the electrodes 602 extend from the top surface 701 to the bottom surface 705 of the dielectric window. The dielectric window 138 has a dielectric window thickness 704 of about 20 mm to about 100 mm. In some embodiments, the faraday shield 600 is embedded at a middle ½ to middle ⅓ of the thickness 704 of the dielectric window. The faraday shield 600 can be printed around and on the dielectric window edges 608 and on the surfaces of the dielectric windows 138, and/or embedded inside the dielectric windows 138. The electrodes are coupled to the dielectric supporting material by coating, printing, plating, or using other processes. Manufacturing the faraday shields 600 can also include sintering at high temperatures using an oven, or other processes. In some embodiments, the electrodes of the faraday shield can have a thickness of about 30 μm or thicker. In some embodiments, the faraday shields 600 together with the dielectric window 138 have a transparency ratio of about 1% to about 99%, such as 10% to about 30%, or about 60% to about 80%. As used herein, "transparency ratio" refers to an electrode surface area over a total surface area of the faraday shield 600 (e.g., electrodes 602) together with the dielectric window 138. A transparency ratio of 100% refers to no electric field going through due to perfect shielding and 0% refers to all of the electric field going through without any shielding.

The showerhead 124 having the inductive coupler 130 and faraday shields 600 described herein can be used for HDP process chambers. The antennas 202 of the inductive coupler 130 and the faraday shields 600 are capable of controlling a degree of ICP or CCP coupling to the plasma at a variety of RF powers. The antennas 202 can be a helix type RF coil of either vertical or flat spiral coils of concentric or rectangular shapes, and of non-flat or vertical shapes. The adjacent coil portions are arranged to locally drive plasma and to interfere or cancel RF magnetic fields generated in order to control constructive or destructive coupling based on coil design.

Figure 7B:
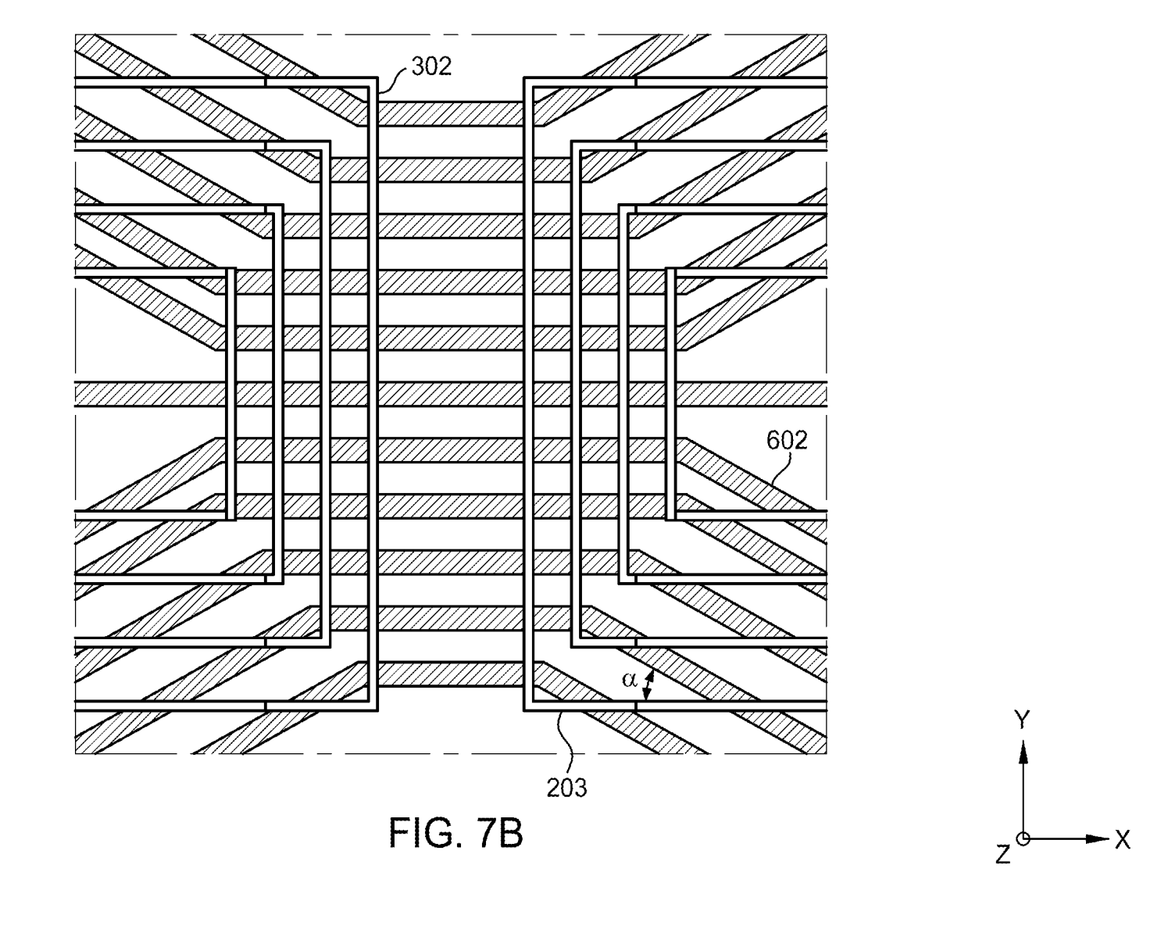
FIG. 7B is a top plan view of a dielectric window having electrodes incorporated therein disposed below portions of two antennas according to an embodiment.

FIG. 7B is a top plan view of a dielectric window having electrodes incorporated therein disposed below portions of two antennas according to an embodiment. Although the portions of each antenna that interface the dielectric window form three sides, other number of sides are also contemplated such that the electrodes 602 of the faraday shield form non-zero angles relative to the portions of the antenna disposed thereover. The electrodes 602 of FIG. 7B are oriented to form a non-zero angle relative to portion 302 of the antenna, and a non-zero angle α relative to first portion 203 of the antenna. In contrast, FIG. 2 depicts the electrodes 602 oriented parallel to first portions 203 of the antenna. The angle and positioning of the electrodes are determined based on power intensity, pressure, temperature, and process gas composition used for a predetermined process. Other electrode arrangements and antenna arrangements are also contemplate.

Figure 8:
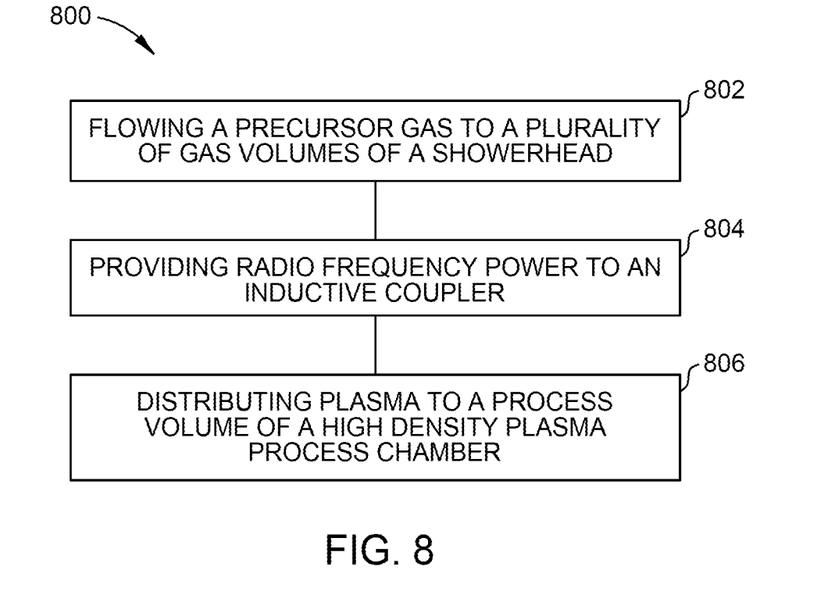
FIG. 8 is a block flow diagram of a method of depositing films over a substrate according to an embodiment.

FIG. 8 is a block flow diagram of a method 800 of depositing films over a substrate according to an embodiment. The method includes, in operation 802, flowing a precursor gas to a plurality of gas volumes of a showerhead. Each of the gas volumes is defined by a perforated tile, support members, and a faraday shield. The faraday shield includes dielectric support material and a plurality of electrodes. In operation 804, a radiofrequency power is provided to an inductive coupler disposed above the faraday shield. The inductive coupler is in electrical communication with each of the gas volumes. In operation 806, plasma is distributed to a process volume of a high density plasma process chamber. The plasma has a plasma density of about $1\times10^{10}$ cm$^3$ to about $10\times10^{12}$ cm$^3$ and each gas volume is maintained at a vacuum volume of about 10 mTorr to about 3 Torr. A film is deposited on a substrate, such as a rectangular substrate, the film is composed of silicon oxide, silicon nitride, silicon-oxide-nitride, or combinations thereof.

The methods, apparatus, and systems provided herein enable high RF power processes for depositing films with uniform thickness over a substrate. Incorporation of a faraday shield disposed between the inductive coupler and plenum (e.g., gas volume) reduces the presence of parasitic plasma within volumes other than the substrate process volume within the high density plasma chamber.

What is claimed is:

1. A method of depositing films on a substrate, comprising:
    flowing a precursor gas to a plurality of gas volumes of a showerhead, each of the gas volumes defined by a perforated tile, support members, and a faraday shield comprising a dielectric window with electrodes embedded therein, wherein the electrodes comprise a first portion and a second portion, the second portion being disposed at a non-parallel angle relative to the first portion, and wherein the first portion of each of the electrodes are disposed parallel to one another;
    providing radiofrequency power to an inductive coupler disposed above the faraday shield, the inductive coupler in electrical communication with each of the gas volumes, wherein the second portion of each of the electrodes is disposed at an angle of between 10° and 170° relative to a linear portion of the inductive coupler; and
    distributing plasma to a process volume of a high density plasma process chamber.

2. The method of claim 1, wherein a film is deposited composed of silicon oxide, silicon nitride, silicon-oxide-nitride, or combinations thereof.

3. The method of claim 1, wherein the radiofrequency power is about 1 KW to about 500 kW.

4. The method of claim 1, wherein the providing radiofrequency power is performed under vacuum.

5. The method of claim 1, wherein the flowing a precursor gas is performed through a plurality of conduits within the support members.

6. The method of claim 1, wherein the perforated tile includes a plurality of openings extending therethrough.

7. The method of claim 1, wherein the first portion of each of the electrodes is disposed parallel to the linear portion of the inductive coupler.

8. The method of claim 1, wherein the inductive coupler comprises a 90 degree bend, and wherein an intersection of the first portion and the second portion of one of the electrodes is vertically aligned with the 90 degree bend of the inductive coupler.

9. The method of claim 1, wherein the second portions of the electrodes are parallel to one another.

10. The method of claim 1, wherein the electrodes comprise a third portion coupled to the first portion opposite the second portion, and wherein the third portions are non-parallel to the first portion and second portion, and wherein the third portions are disposed at an angle of between 10° and 170° relative to a linear portion of the inductive coupler.

11. A method of depositing films on a substrate, comprising:
    flowing a precursor gas to a plurality of gas volumes of a showerhead, each of the gas volumes defined by a perforated tile, support members, and a plurality of faraday shields coupled to one or more dielectric windows, each faraday shield comprising a plurality of electrodes embedded therein, wherein the electrodes comprise a first portion and a second portion, the second portion being disposed at a non-parallel angle relative to the first portion, and wherein the first portion of each of the electrodes are disposed parallel to one another;
    providing radiofrequency power to an inductive coupler disposed above the plurality of faraday shields, the inductive coupler in electrical communication with each of the gas volumes, wherein the second portion of each of the electrodes is disposed at an angle of between 10° and 170° relative to a linear portion of the inductive coupler, the first portion of each of the electrodes being disposed parallel to the linear portion of the inductive coupler; and
    distributing plasma to a process volume of a high density plasma process chamber.

12. The method of claim 11, wherein each gas volume is maintained at a vacuum pressure of about 10 mTorr to 3 Torr.

13. The method of claim 11, wherein the radiofrequency power is about 1 KW to about 500 kW.

14. The method of claim 11, wherein the flowing a precursor gas is performed through a plurality of conduits within the support members.

15. The method of claim 11, wherein the perforated tile includes a plurality of openings extending therethrough.

16. The method of claim 11, wherein the inductive coupler includes an antenna disposed proximate to the one or more dielectric windows.

17. A method of depositing films on a substrate, comprising:

flowing a precursor gas to a plurality of gas volumes of a showerhead, each of the gas volumes defined by a perforated tile, support members, and a dielectric window comprising a faraday shield with electrodes embedded therein, wherein the faraday shield is embedded within the dielectric window, wherein the electrodes comprise a central portion, a first end portion, and a second end portion, the first and second end portions being disposed at a non-parallel and non-perpendicular angle relative to the central portion, and wherein the central portion of each of the electrodes are disposed parallel to one another;

providing radiofrequency power to an inductive coupler disposed above the faraday shield, the inductive coupler in electrical communication with each of the gas volumes, wherein the first and second end portions of each of the electrodes is disposed at an angle of between 10° and 170° relative to a linear portion of the inductive coupler, the central portion of each of the electrodes being disposed parallel to the linear portion of the inductive coupler; and distributing plasma to a process volume of a high density plasma process chamber.

18. The method of claim 17, wherein the dielectric window and the faraday shield have a combined transparency ratio of about 1% to about 99%.

19. The method of claim 17, wherein the dielectric window further comprises one or more additional faraday shields.

20. The method of claim 17, wherein the faraday shield is embedded within a middle half to a middle third of a thickness of the dielectric window.

21. The method of claim 17, wherein each gas volume is maintained at a vacuum pressure of about 10 mTorr to 3 Torr.

22. The method of claim 17, wherein the radiofrequency power is about 1 KW to about 500 KW.

* * * * *